(12) United States Patent
Dickey et al.

(10) Patent No.: US 11,616,010 B2
(45) Date of Patent: Mar. 28, 2023

(54) TRANSISTOR ASSEMBLIES

(71) Applicant: Hamilton Sundstrand Corporation, Charlotte, NC (US)

(72) Inventors: John A. Dickey, Caledonia, IL (US); David M. Kucharski, Delavan, WI (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 89 days.

(21) Appl. No.: 15/640,137

(22) Filed: Jun. 30, 2017

(65) Prior Publication Data
US 2019/0006274 A1    Jan. 3, 2019

(51) Int. Cl.
*H01L 23/528* (2006.01)
*H01L 23/50* (2006.01)
*H01L 25/11* (2006.01)
*H01L 23/66* (2006.01)

(52) U.S. Cl.
CPC ............. *H01L 23/50* (2013.01); *H01L 23/66* (2013.01); *H01L 25/115* (2013.01); *H01L 2223/665* (2013.01); *H01L 2924/13055* (2013.01); *H01L 2924/13091* (2013.01); *H01L 2924/3011* (2013.01)

(58) Field of Classification Search
CPC ......... H01L 23/50; H01L 25/115; H01L 23/66
See application file for complete search history.

(56) References Cited

U.S. PATENT DOCUMENTS

| | | | | |
|---|---|---|---|---|
| 2,284,291 | A * | 5/1942 | May ...................... | H01H 85/36 337/164 |
| 6,034,423 | A * | 3/2000 | Mostafazadeh ..... | H01L 23/3128 257/666 |
| 6,153,929 | A * | 11/2000 | Moden .................. | H05K 1/181 257/686 |
| 6,307,755 | B1 * | 10/2001 | Williams ............ | H01L 23/4334 361/813 |
| 7,052,938 | B2 | 5/2006 | Estacio et al. | |
| 7,955,902 | B2 | 6/2011 | Hata et al. | |
| 9,601,453 | B2 | 3/2017 | Hebert | |
| 2008/0054373 | A1* | 3/2008 | Chen ................. | H01L 23/49562 257/401 |
| 2009/0200864 | A1* | 8/2009 | Maier ................. | B60R 16/0207 307/9.1 |
| 2009/0219696 | A1* | 9/2009 | Nakayama ............ | H02M 7/003 361/709 |
| 2012/0032259 | A1* | 2/2012 | Ho ........................ | H01L 23/481 257/330 |

(Continued)

FOREIGN PATENT DOCUMENTS

JP    2004-152859    *  5/2004

*Primary Examiner* — Jarrett J Stark
(74) *Attorney, Agent, or Firm* — Locke Lord LLP; Scott D. Wofsy; Alicia J. Carroll

(57) ABSTRACT

A transistor module assembly includes a longitudinally extending load bus bar, a longitudinally extending feed bus bar parallel to the load bus bar, and at least one transistor package operatively connected to the load and feed bus bars. The transistor package includes a drain surface and a source lead. The drain surface is operatively connected to the feed bus bar for receiving current therefrom. The source lead is operatively connected to the load bus bar for dissipating current from the transistor package to the load bus bar.

24 Claims, 2 Drawing Sheets

(56) References Cited

U.S. PATENT DOCUMENTS

| | | | | |
|---|---|---|---|---|
| 2013/0271941 A1* | 10/2013 | Guan | ............... | H05K 7/18 |
| | | | | 361/811 |
| 2014/0035120 A1* | 2/2014 | Nishi | ............... | H01L 23/42 |
| | | | | 257/691 |
| 2014/0319601 A1* | 10/2014 | Ho | ............... | H01L 29/7827 |
| | | | | 257/330 |
| 2014/0321090 A1* | 10/2014 | Guerin | ............... | H02M 7/003 |
| | | | | 361/782 |
| 2014/0355219 A1* | 12/2014 | Tada | ............... | H05K 1/0263 |
| | | | | 361/729 |
| 2015/0207287 A1 | 7/2015 | Creviston et al. | | |
| 2017/0345799 A1* | 11/2017 | Rowden | ............... | H01L 25/072 |

\* cited by examiner

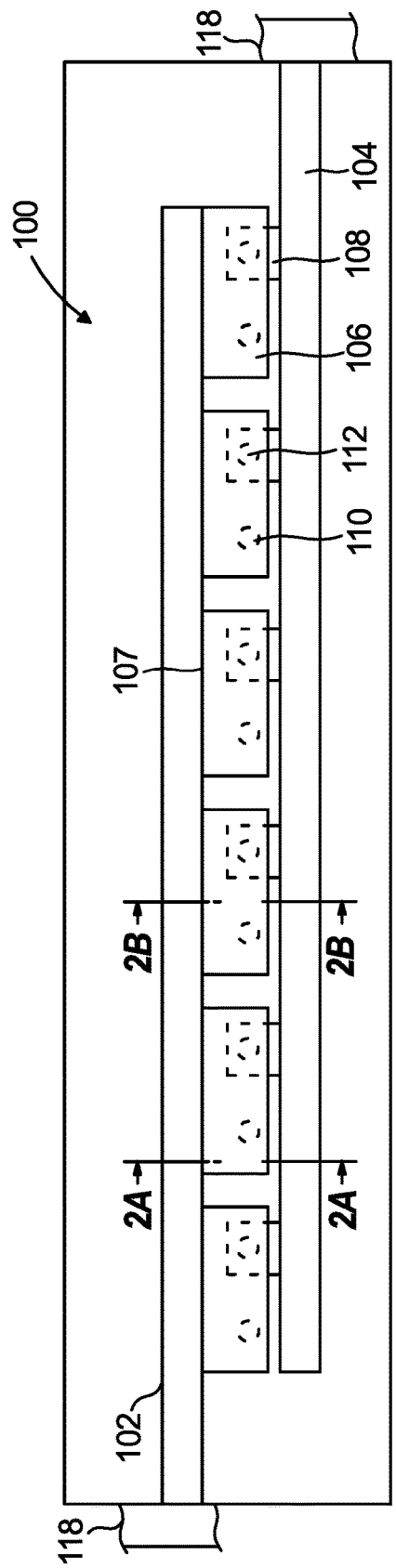
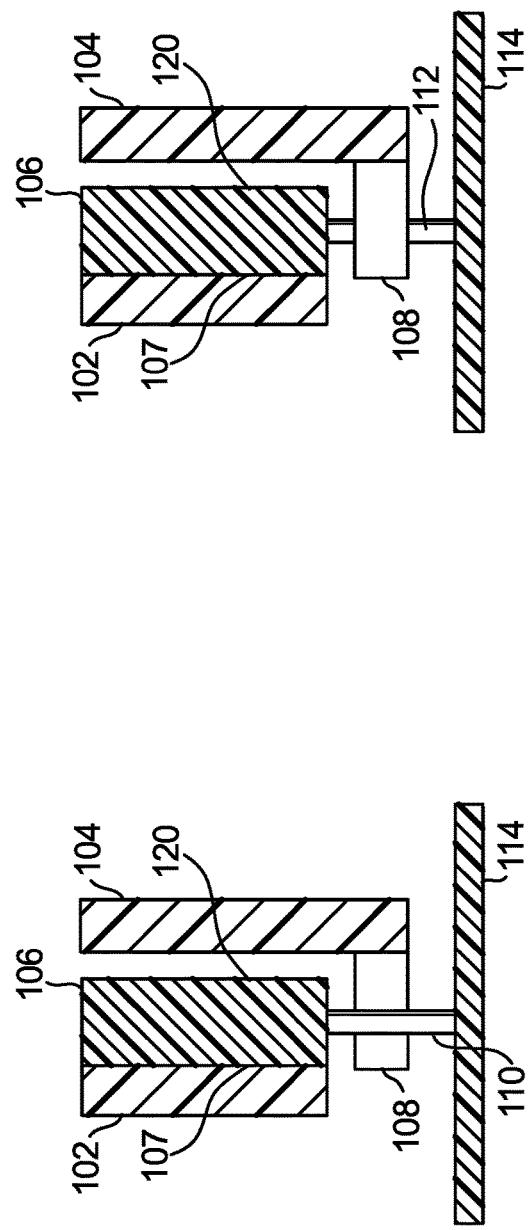
Fig. 1
Fig. 2A
Fig. 2B

TRANSISTOR ASSEMBLIES

BACKGROUND OF THE INVENTION

1. Field of the Invention

The present disclosure relates to power distribution systems, and more particularly to electrical interconnects in power distribution systems.

2. Description of Related Art

Power in electrical systems, such as aircraft electrical systems, is generally routed from power sources like generators and batteries through field effect transistors (FET), e.g. metal oxide semiconductor field effect transistors (MOSFETs). When using multiple power MOSFETs in an array, the potentially high interconnect resistance and impedance of feed and load side connections using a printed wiring board (PWB) can limit the power capacity of the array. Additionally, it can be difficult to remove heat from the array.

Such conventional methods and systems have generally been considered satisfactory for their intended purpose. However, there is still a need in the art for improved switch assemblies and higher current arrays. The present disclosure provides a solution for this need.

SUMMARY OF THE INVENTION

A transistor module assembly includes a longitudinally extending load bus bar, a longitudinally extending feed bus bar parallel to the load bus bar, and at least one transistor package operatively connected to the load and feed bus bars. The transistor package includes a drain surface and a source lead. The drain surface is operatively connected to the feed bus bar for receiving current therefrom. The source lead is operatively connected to the load bus bar for dissipating current from the transistor package to the load bus bar.

In accordance with some embodiments, the transistor module assembly includes a printed wiring board (PWB) operatively connected to a gate lead of the at least one transistor package. The gate lead and the source lead can extend from the same side of the transistor package. The load bus bar can include a tab extending transversely from the load bus bar. The source lead can be operatively connected to the tab of the load bus bar. The transistor package can be a MOSFET package. An end of the load bus bar and an end of the feed bus bar can include respective transverse legs.

It is contemplated that the tab can be one of a series of tabs extending transversely from the load bus bar. The tabs can be longitudinally spaced apart along the load bus bar. The at least one transistor package can be one of multiple transistor packages. The source lead of each transistor package can be operatively connected to a respective one of the tabs. Each transistor package can include a respective gate lead connected to the PWB. The PWB can interconnect the gate leads of the multiple transistor packages. An end of the load bus bar and an end of the feed bus bar can be bolted to the main power connections. The load bus bar and the feed bus bar are opposite from one another across the transistor package. The load bus bar is proximate to an insulated surface of the transistor package.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein:

FIG. 1 is a schematic view of an exemplary embodiment of a transistor module assembly constructed in accordance with the present disclosure, showing the load bus bar and the feed bus bar having transistor packages operatively connected thereto;

FIG. 2A is a schematic view of a cross-section of the transistor module assembly of FIG. 1, showing the gate lead mounted to the PWB;

FIG. 2B is a schematic view of a cross-section of the transistor module assembly of FIG. 1, showing the source lead connected to one of the tabs of the load bus bar.

DETAILED DESCRIPTION OF THE PREFERRED EMBODIMENTS

Figure 3:
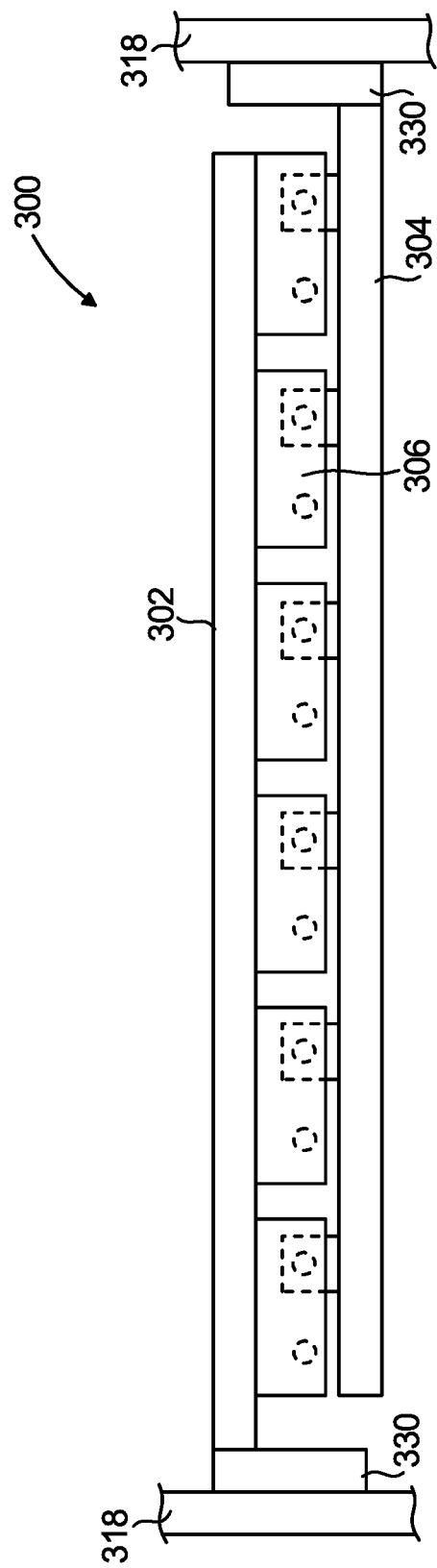
FIG. 3 is a schematic view of another exemplary embodiment of a transistor module assembly constructed in accordance with the present disclosure, showing longitudinally extending bus bars, each with respective transverse end legs.

Reference will now be made to the drawings wherein like reference numerals identify similar structural features or aspects of the subject disclosure. For purposes of explanation and illustration, and not limitation, a partial view of an exemplary embodiment of a transistor module assembly in accordance with the disclosure is shown in FIG. 1 and is designated generally by reference character 100. Other embodiments of transistor module assembly and methods of making transistor module assemblies in accordance with the disclosure, or aspects thereof, are provided in FIGS. 2A-3, as will be described. The systems and methods described herein can be used in electrical systems, such as in aircraft power distribution systems, though the present disclosure is not limited to aircraft or to power distribution systems in general.

As shown in FIG. 1, a transistor module assembly 100 includes a longitudinally extending load bus bar 104, and a longitudinally extending feed bus bar 102 parallel to load bus bar 104. Transistor module assembly 100 includes transistor packages 106 operatively connected to the load and feed bus bars, 104 and 102, respectively. Transistor packages 106 can include a variety of devices, e.g. solid-state switch devices such as, metal-oxide-semiconductor field-effect-transistors (MOSFET), insulated-gate bipolar-transistors (IGBT), or any other suitable type of switch device. Because the primary currents in and out of transistor packages 106 flow through major bus bars, as opposed to the printed wiring board (PWB), transistor module assembly 100 provides very low impedance connections to the feed/drain and load/source sides of transistor packages 106. This allows for more power and heat to flow in and out and results in a modular structure that is easily assembled into a large array of devices for high power applications.

With continued reference to FIG. 1, load bus bar 104 includes a series of longitudinally spaced apart tabs 108 extending transversely from load bus bar 104. Load bus bar 104 and feed bus bar 102 are opposite from one another across transistor package 106. An end of load bus bar 104 and an end of feed bus bar 102 are operatively connected to main power connections 118 (schematically shown). Feed bus bar 102 and main power connections 118 can be bolted together, soldered together, brazed together, or the like. Those skilled in the art will readily appreciate that, in the case of feed bus bar 102, main power connections 118 can be to a main power bus, and, for load bus bar 104, main power connections 118 can be electrically connected with one or more power-consuming devices or loads.

As shown in FIGS. 2A and 2B, each transistor package 106 includes a drain surface 107 is operatively connected to feed bus bar 102, e.g. can be soldered, bolted, or fastened in another manner, for receiving current from feed bus bar 102. Each transistor package 106 includes a respective gate lead 110. A PWB 114 is operatively connected to each gate lead 110 and interconnects gate leads 110 of multiple transistor packages 106. A source lead 112 extends from each transistor package 106 and is operatively connected, e.g. soldered or otherwise fastened, to a respective one of tabs 108 for conducting current from transistor package 106 to load bus bar 104. Source lead 112 is also operatively connected, e.g. soldered to, PWB 114. Source lead 112 is used as a reference for gate lead 110. Gate lead 110 and source lead 112 extend from the same side of transistor package 106. Load bus bar 104 is adjacent to an insulated surface 120 of each transistor package 106. There can be a gap between load bus bar 104 and insulated surface 120, as shown in the figures, or load bus bar 104 can directly abut surface 120. The insulation material, not shown, can be positioned between insulated surface 120 and load bus bar 104. Both feed bus bar 102 and load bus bar 104 also carry heat from transistor package 106 out to main power connections 118, which improves overall heat dissipation from the array, thus resulting in high packaging density capabilities.

As shown in FIG. 3, a transistor module assembly 300 is similar to a transistor module assembly 100 described above. Transistor module assembly 300 includes a longitudinally extending load bus bar 304, a longitudinally extending feed bus bar 302 parallel to load bus bar 304, and transistor packages 306 operatively connected to load and feed bus bars, 304 and 302, respectively. Longitudinally extending load bus bar 304, longitudinally extending feed bus bar 302, and transistor packages 306, are all similar to longitudinally extending load bus bar 104, longitudinally extending feed bus bar 102, and transistor packages 106, respectively. Transistor module assembly 300, however, includes a longitudinally extending load bus bar 304 and a longitudinally extending feed bus bar 302 with respective transverse legs 330. By using transverse legs 330, the assembly is easily accessed for fastening via the top and bottom of assembly 300, e.g. the right side of transverse leg 330 on the right and the left side of transverse leg 330 on the left, as oriented in FIG. 3, allowing for access for mounting to main power connections 318 without interference from adjacent modules being in the way. This orientation provides for additional versatility in creating the electrical connections between load and feed bus bars, 304 and 302, and main power connections 318.

The methods and systems of the present disclosure, as described above and shown in the drawings provide for transistor module assemblies with superior properties including reduced electrical impedance and/or reduced heat generation from electrical current flow traversing the transistor module assemblies. While the apparatus and methods of the subject disclosure have been shown and described with reference to preferred embodiments, those skilled in the art will readily appreciate that change and/or modifications may be made thereto without departing from the scope of the subject disclosure.

What is claimed is:

1. A transistor module assembly, comprising:
    a printed wiring board (PWB);
    a longitudinally extending load bus bar;
    a longitudinally extending feed bus bar parallel to the load bus bar; and
    multiple transistor packages operatively connected to the load and feed bus bars, wherein each transistor package includes a drain surface operatively connected to the feed bus bar for receiving current therefrom, and a source lead operatively connected to the load bus bar for dissipating current from the transistor package to the load bus bar, wherein the load bus bar and the feed bus bar are opposite from one another across an entirety of a respective one of the multiple transistor packages in a direction perpendicular to the drain surface of the respective one of the multiple transistor packages, wherein the source lead directly connects to the PWB.

2. The transistor module assembly as recited in claim 1, wherein the PWB is operatively connected to a gate lead of the respective one of the multiple transistor packages.

3. The transistor module assembly as recited in claim 2, wherein the gate lead and the source lead extend from the same side of the respective one of the multiple transistor packages.

4. The transistor module assembly as recited in claim 1, wherein the load bus bar includes a tab extending transversely from the load bus bar.

5. The transistor module assembly as recited in claim 4, wherein each source lead is operatively connected to the tab of the load bus bar.

6. The transistor module assembly as recited in claim 4, wherein the tab is one of a series of tabs that are longitudinally spaced apart along the load bus bar.

7. The transistor module assembly as recited in claim 1, wherein each transistor package includes a respective gate lead connected to the PWB, wherein the PWB interconnects the gate leads of the multiple transistor packages.

8. The transistor module assembly as recited in claim 1, wherein an end of the load bus bar and an end of the feed bus bar are bolted to main power connections.

9. The transistor module assembly as recited in claim 1, wherein the load bus bar includes a series of longitudinally spaced apart tabs extending transversely from the load bus bar, and wherein the source lead of each transistor package is operatively connected to a respective one of the series of tabs.

10. The transistor module assembly as recited in claim 1, wherein the load bus bar is proximate to the insulated surface of at least one of the transistor packages.

11. The transistor module assembly as recited in claim 1, wherein at least one of the transistor packages is a MOSFET package.

12. The transistor module assembly as recited in claim 1, wherein an end of the load bus bar and an end of the feed bus bar includes respective transverse legs.

13. A transistor module assembly, comprising:
    a printed wiring board (PWB);
    a longitudinally extending load bus bar;
    a longitudinally extending feed bus bar parallel to the load bus bar; and
    multiple transistor packages operatively connected to the load and feed bus bars, wherein each transistor package includes a drain surface operatively connected to the feed bus bar for receiving current therefrom, a source lead operatively connected to the load bus bar for dissipating current from the transistor package to the load bus bar, and a gate lead extending from the transistor package, wherein each gate lead and each source lead each extend from the same side of their respective transistor packages and in the same longitudinal direction, wherein the source lead directly connects to the PWB.

14. The transistor module assembly as recited in claim 13, wherein the PWB is operatively connected to the gate lead of at least one of the transistor packages.

15. The transistor module assembly as recited in claim 13, wherein the load bus bar includes a tab extending transversely from the load bus bar.

16. The transistor module assembly as recited in claim 15, wherein the source lead of at least one of the transistor packages is operatively connected to the tab of the load bus bar.

17. The transistor module assembly as recited in claim 15, wherein the tab is one of a series of tabs that are longitudinally spaced apart along the load bus bar.

18. The transistor module assembly as recited in claim 13, wherein each respective gate lead of the multiple transistor packages is connected to the PWB, wherein the PWB interconnects the gate leads of the multiple transistor packages.

19. The transistor module assembly as recited in claim 13, wherein the load bus bar and the feed bus bar are opposite from one another across an entirety a respective one of the multiple transistor packages in a direction perpendicular to the drain surface of the respective one of the multiple transistor packages.

20. The transistor module assembly as recited in claim 13, wherein the load bus bar is proximate to the insulated surface of the transistor package.

21. The transistor module assembly as recited in claim 6, wherein each source lead is fastened to the PWB and a respective one of the series of tabs.

22. The transistor module assembly as recited in claim 17, wherein each source lead is fastened to the PWB and a respective one of the series of tabs.

23. The transistor module assembly as recited in claim 1, wherein each source lead is soldered to the PWB.

24. The transistor module assembly as recited in claim 13, wherein each source lead is soldered to the PWB.

\* \* \* \* \*